United States Patent
Lee et al.

(10) Patent No.: US 9,202,549 B2
(45) Date of Patent: Dec. 1, 2015

(54) SEMICONDUCTOR MEMORY DEVICE AND MEMORY SYSTEM INCLUDING THE SAME

(71) Applicant: SK hynix Inc., Gyeonggi-do (KR)

(72) Inventors: Yo-Sep Lee, Gyeonggi-do (KR); Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/098,032

(22) Filed: Dec. 5, 2013

(65) Prior Publication Data

US 2014/0369109 A1 Dec. 18, 2014

(30) Foreign Application Priority Data

Jun. 17, 2013 (KR) .......................... 10-2013-0069152

(51) Int. Cl.
*G11C 11/4074* (2006.01)
*G11C 11/406* (2006.01)
*G11C 11/408* (2006.01)

(52) U.S. Cl.
CPC ............ *G11C 11/406* (2013.01); *G11C 11/408* (2013.01); *G11C 11/4087* (2013.01)

(58) Field of Classification Search
CPC ................. G11C 11/40615; G11C 13/0033; G11C 11/404; G11C 11/4074; G11C 11/4091
USPC .................................. 365/149, 222, 200, 201
See application file for complete search history.

(56) References Cited

U.S. PATENT DOCUMENTS

| | | | |
|---|---|---|---|
| 6,882,215 B1 * | 4/2005 | Lee | 327/536 |
| 7,486,583 B2 * | 2/2009 | Lee | 365/222 |
| 2006/0023546 A1 * | 2/2006 | Park | 365/222 |
| 2006/0176749 A1 * | 8/2006 | Dono et al. | 365/222 |
| 2006/0215474 A1 * | 9/2006 | Hokenmaier | 365/222 |
| 2007/0076504 A1 * | 4/2007 | Suh | 365/222 |

FOREIGN PATENT DOCUMENTS

KR 100735024 7/2007

* cited by examiner

*Primary Examiner* — Shawki S Ismail
*Assistant Examiner* — Muhammad S Islam
(74) *Attorney, Agent, or Firm* — IP & T Group LLP

(57) ABSTRACT

A semiconductor memory device includes a plurality of word lines each of which are connected to a plurality of memory cells, a row control unit suitable for sequentially activating and precharging a word line corresponding to a target address and a predetermined (N) number of adjacent word lines during a target activation mode, and a mode exit control unit suitable for counting the number of activation operations by the row control unit during the target activation mode to determine whether or not to exit from the target activation mode.

23 Claims, 7 Drawing Sheets

SEMICONDUCTOR MEMORY DEVICE AND MEMORY SYSTEM INCLUDING THE SAME

CROSS-REFERENCE TO RELATED APPLICATIONS

The present application claims priority of Korean Patent Application No, 10-2013-0069152, filed on Jun. 17, 2013, which is incorporated herein by reference in its entirety.

BACKGROUND

1. Field

Exemplary embodiments of the present invention relate to a semiconductor design technology, and more particularly, to a semiconductor memory device for preventing the degradation due to word line disturbance, an operating method thereof, and a memory system including the semiconductor memory device.

2. Description of the Related Art

As the degree of integration of a memory increases, a space between word lines included in the memory such as a DRAM is reduced. As the space between the word lines is reduced, a coupling effect between adjacent word lines may increase.

Meanwhile, whenever data is inputted and outputted to or from a memory cell, a word line toggles between an activated state and a deactivated state. Since the coupling effect between adjacent word lines may increase as described above, the data of a memory cell connected with a word line adjacent to a frequently activated word line may be degraded. Such a phenomenon is called word line disturbance or word line hammer. Due to the word line disturbance, the data of a memory cell may be degraded within an expected retention time of the memory cell to be refreshed.

FIG. 1 is a diagram illustrating a part of a cell array included in a DRAM for explaining the word line disturbance.

In FIG. 1, 'WLL' corresponds to a frequently activated word line, which has a large number of activation times (or a high activation frequency). Further, 'WLL−1' and 'WLL+1' correspond to adjacent word lines, which are disposed adjacent to the frequently activated word line WLL. Furthermore, 'CL' denotes a memory cell connected to the frequently activated word line WLL, 'CL−1' denotes a memory cell connected with the adjacent word line WLL−1, and 'CL+1' denotes a memory cell connected with the adjacent word line WLL−1. The memory cells CL, CL−1 and CL+1 include cell transistors TL, TL−1 and TL+1 and cell capacitors CAPL, CAPL−1 and CAPL+1, respectively. For reference, 'BL' and 'BL+1' denote bit lines.

When the frequently activated word line WLL is activated or deactivated, the voltages of the adjacent word lines WLL−1 and WLL+1 are increased or decreased due to a coupling phenomenon occurring among the word lines WLL, WLL−1 and WLL+1. Accordingly, the amount of charges charged in the cell capacitors CAPL−1 and CAPL+1 is affected, so that the data of the memory cells CL−1 and the CL+1 may be degraded.

Furthermore, as electromagnetic waves, which are generated while the word line toggles between the activated state and the deactivated state, introduce or discharge electrons into or from the cell capacitors of the memory cells connected with adjacent word fines, data are likely to be degraded.

SUMMARY

Various embodiments are directed to a semiconductor memory device, which may refresh memory cells connected to word lines adjacent to a word line with a large number of activation times (or a high activation frequency), an operating method thereof, and a memory system including the semiconductor memory device.

Also, various embodiments are directed to a semiconductor memory device, which may refresh the memory cells connected to word lines adjacent to a word line with a large number of activation times (or a high activation frequency) without being applied with separate addresses, an operating method thereof, and a memory system including the semiconductor memory device.

In an embodiment, a semiconductor memory device may include a plurality of word lines each of which are connected to a plurality of memory cells, a row control unit suitable for sequentially activating and precharging a word line corresponding to a target address and a predetermined (N) number of adjacent word lines during a target activation mode, and a mode exit control unit suitable for counting the number of activation operations by the row control unit during the target activation mode to determine whether or not to exit from the target activation mode.

In an embodiment, a memory system may include a memory controller suitable for transmitting a mode register set (MRS) setting signal or a target activation command for entry into a target activation mode, active and precharge commands for performing activation and precharge operations, and a source address for selecting the word lines, wherein the source address is classified as a target address of which activation-precharge history satisfies a predetermined condition and a normal address of which activation-precharge history does not satisfy the predetermined condition, and a semiconductor memory device suitable for entering the target activation mode in response to the MRS setting signal or the target activation command, sequentially activating and precharging a target word line corresponding to the target address and a predetermined (N) number of adjacent word lines during the target activation mode, and exiting from the target activation mode by counting the number of activation operations.

In an embodiment, a method for operating a semiconductor memory device with a plurality of word lines may include entering a target activation mode by a mode register set (MRS) setting or a preset command, sequentially activating and precharging a target word line corresponding to a target address and a predetermined (N) number of adjacent word lines, in response to application of the target address and an active command, and exiting from the target activation mode by counting the number of times of activation of the target word line and the adjacent word lines during the target activation mode.

The method may further comprise receiving a source address for selecting the word lines; classifying the source address as the target address and a normal address when the target activation mode is entered; activating and precharging a word line corresponding to the normal address when the normal address and the active command are applied after the entering of the target activation mode; and activating and precharging a word line corresponding to the source address when the source address and the active command are applied after the exiting from the target activation mode.

The semiconductor memory device may exit from the target activation mode when a counting number reaches N+1.

The method may further comprise: latching the target address after the classifying of the source address; and determining whether a value of the received source address corresponds to a value of the latched target address, after the entering of the target activation mode.

The sequentially activating and precharging of the target word line may comprises: a first activating action of activating and precharging the word line corresponding to the target address in response to that the value of the source address applied through the receiving corresponds to the value of the target address, when the active command is applied after the entering action; selecting the N number of addresses with sequentially adjacent values when viewed in both directions from the value of the source address corresponding to the value of the target address, at a time for performing the first activating action; and a second activating action of sequentially activating and precharging the word lines corresponding to the N number of addresses selected in the selecting, each time the value of the source address applied through the receiving corresponds to the value of the target address, when the active command is applied after the first activating action.

The selecting may select at least two addresses respectively corresponding to at least two word lines which are disposed physically adjacent on both sides to the word line corresponding to the source address with the value of the target address, among the plurality of word lines, as the N number of addresses.

According to the above embodiments, it may be possible to refresh memory cells connected to word lines adjacent to a word line with a large number of activation times (or a high activation frequency), thereby substantially preventing the data of the memory cells from being degraded due to word line disturbance.

Also, according to the above embodiments, it may be possible to refresh the memory cells connected to word lines adjacent to a word line with a large number of activation times (or a high activation frequency), without being applied with separate addresses, thereby shortening a time required to prevent the data of the memory cells from being degraded due to word line disturbance.

DETAILED DESCRIPTION

Figure 1:
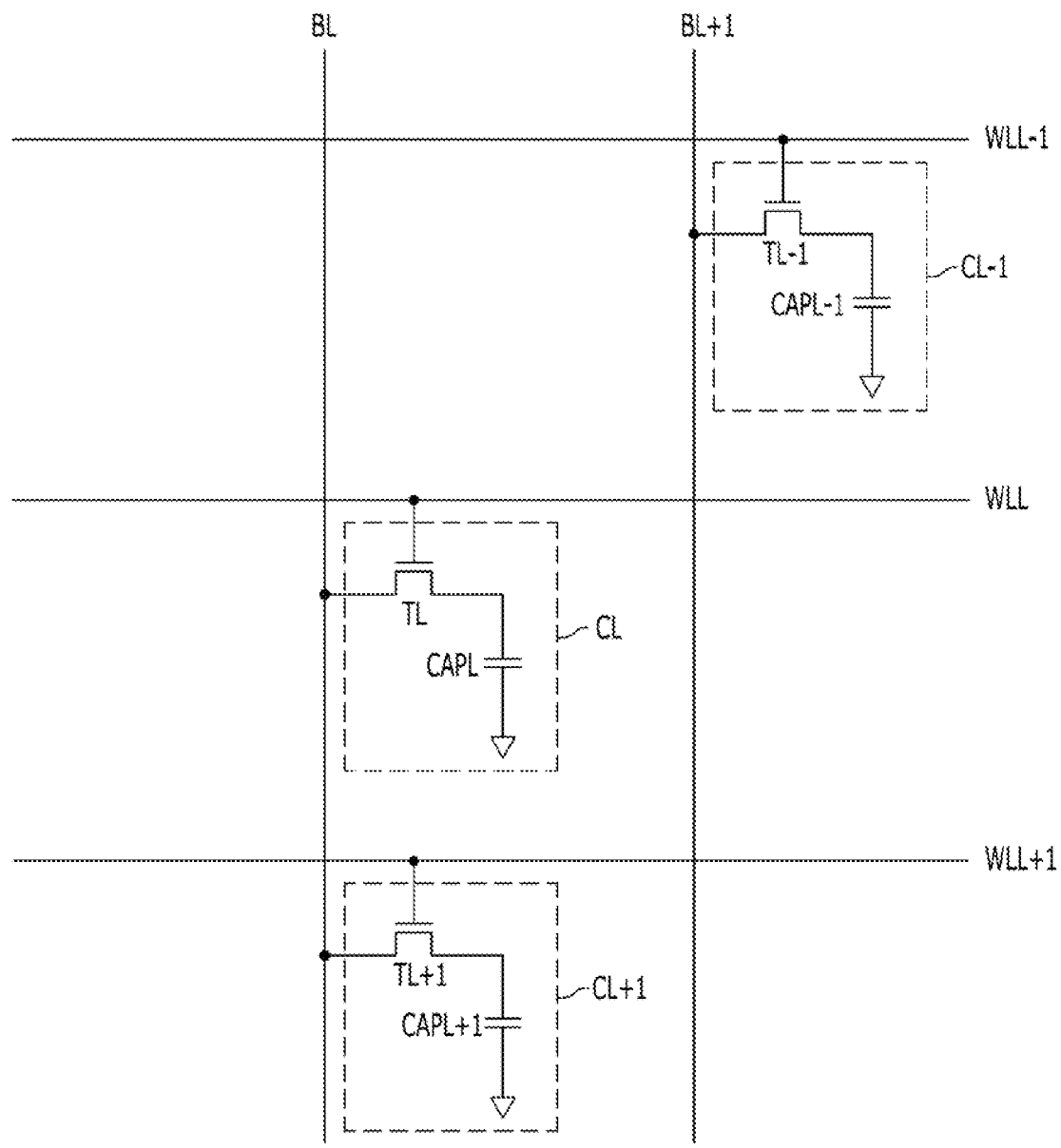
FIG. 1 is a diagram illustrating a part of a cell array included n a DRAM for explaining word line disturbance.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition a singular form may include a plural form as long as it is not specifically mentioned in a sentence.

Figure 2:
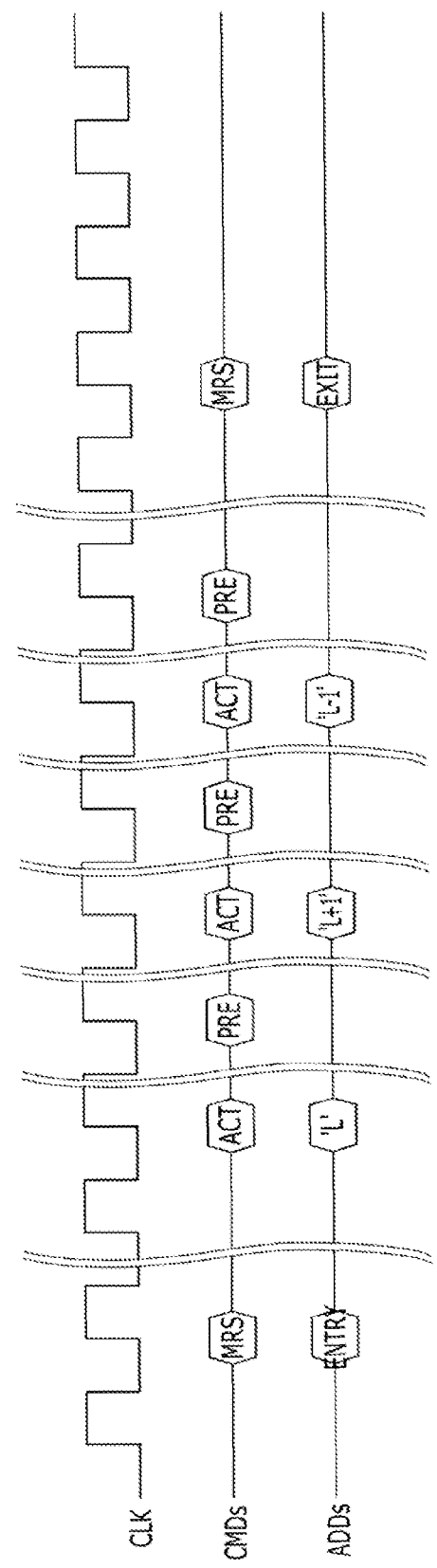
FIG. 2 is a timing diagram for describing an operation in a target activation mode.

FIG. 2 is a diagram for describing an operation in a target activation mode or a target activating operation. In the following descriptions, the target activation mode means a special refresh mode in which adjacent word lines, which are disposed adjacent to a target word line or a frequently activated word line, having a large number of activation times (or a high activation frequency) may be refreshed or activated.

A semiconductor memory device includes a plurality of word lines, and a memory controller (not shown in FIG. 2) applies various signals such as command signals CMDs, addresses ADDS and data (not shown in FIG. 2) to the semiconductor memory device to control the semiconductor memory device. Hereinafter, the value of an address corresponding to an $L^{th}$ word line, wherein L is a natural number larger than 1, among the word lines will be denoted by 'L'.

The semiconductor memory device or the memory controller detects a target address of a target word line with a large number of activation times (or a high activation frequency) among the word lines, in a predetermined manner.

When the target address is detected, the memory controller applies the command signals CMDs and the addresses ADDs to allow the semiconductor memory device to perform a target activating operation. The semiconductor memory device enters the target activation mode in response to the applied commands CMDs and addresses ADDs.

In the target activating operation, the memory controller applies the target address and adjacent addresses corresponding to word lines adjacent to the target word line, to the semiconductor memory device. Hereinbelow, descriptions will be made for the case where the target address is 'L'.

In the target activating operation, the target address L is applied to the semiconductor memory device together with an active command ACT, and after a predetermined time passes, a precharge command PRE is applied to the semiconductor memory device. The semiconductor memory device activates and then precharges or deactivates the target word line.

Next, adjacent addresses L+1 and L−1 are sequentially applied. In FIG. 2, the adjacent address L+1 is applied together with a second active command ACT, and the adjacent address L−1 is applied together with a third active command ACT. Accordingly, adjacent word lines WLL+1 and WLL−1 corresponding to the adjacent addresses L+1 and L−1 are respectively activated, and the memory cells connected to the adjacent word lines WLL+1 and WLL−1 are refreshed. An order in which the adjacent addresses L+1 and L−1 are applied may be changed.

In the case where degradation of data due to word line disturbance is prevented in such way, since the memory controller should directly input the commands CMDs and the addresses ADDs L, L+1 and L−1 for refreshing the target word line and the adjacent word lines, to the semiconductor memory device, respectively, a operation time may increase.

Figure 3:
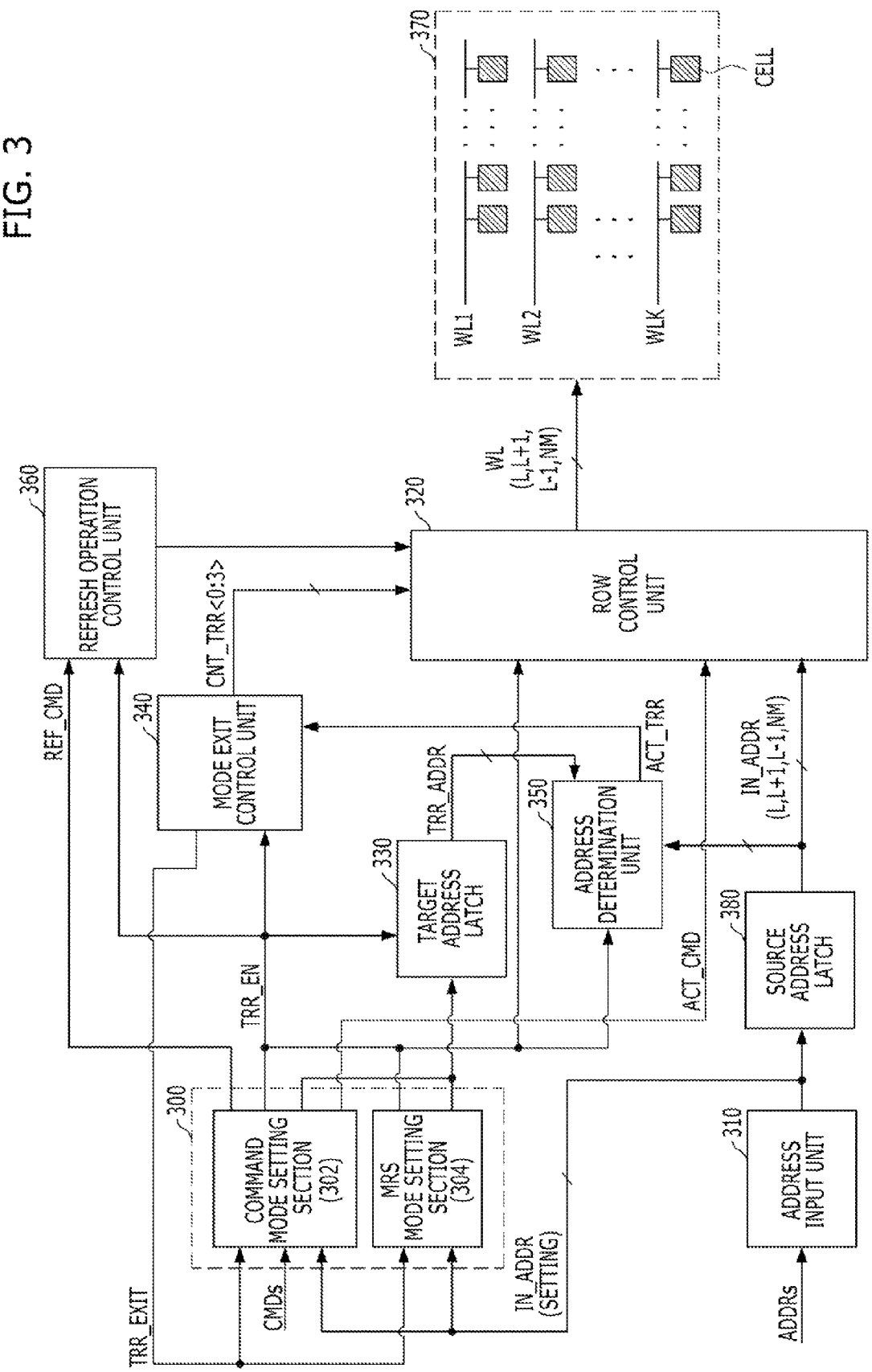
FIG. 3 is a block diagram illustrating a semiconductor memory device in accordance with an embodiment of the present invention.

FIG. 3 is a block diagram illustrating a semiconductor memory device in accordance with an embodiment of the present invention.

Referring to FIG. 3, the semiconductor memory device may include a memory cell array 370, a mode setting unit 300, an address input unit 310, a row control unit 320, a target address latch 330, a mode exit control unit 340, an address determination unit 350, a refresh operation control unit 360, and a source address latch 380. Here, the mode setting unit 300 may include a command mode setting section 302 and/or an MRS mode setting section 304.

The mode setting unit 300 may set the semiconductor memory device to enter a target activation mode in response to an MRS setting or a preset command, and set the semiconductor memory device to exit from the target activation mode in response to a mode exit signal TRR_EXIT. The mode setting unit 300 may set a value of a target address TRR_ADDR.

In detail, the mode setting unit 300 causes the semiconductor memory device to enter the target activation mode, by activating a mode enable signal TRR_EN in response to the MRS setting or the preset command. Also, the mode setting unit 300 causes the semiconductor memory device to exit from the target activation mode, by deactivating the mode enable signal TRR_EN in response to activation of the mode exit signal TRR_EXIT. Moreover, the mode setting unit 300 may set the value of the target address TRR_ADDR by being inputted with an optional signal representing the value of the target address TRR_ADDR. For example, the mode setting unit 300 may determine the value of the target address TRR_ADDR by being inputted with an MRS setting code SETTING, which corresponds to certain bits of a source address IN_ADDR applied through the address input unit 310 from an outside of the semiconductor memory device.

That is, during the target activation mode, the mode enable signal TRR_EN maintains an activated state. Conversely, after exiting from the target activation mode, the mode enable signal TRR_EN maintains a deactivated state. Even when the target activation mode is entered, general operations of the semiconductor memory device may be performed. That is, even when the target activation mode is entered, the general operations of the semiconductor memory device such as data reading/writing may be performed without limit. Since the source address IN_ADDR applied through the address input unit 310 does not have the value of the target address TRR_ADDR during the target activation mode, the row control unit 320 may not perform the target activating operation.

The mode setting unit 300 includes the command mode setting section 302 and/or the MRS mode setting section 304. That is, the mode setting unit 300 may include only the command mode setting section 302, may include only the MRS mode setting section 304, or may include both the command mode setting section 302 and the MRS mode setting section 304. The command mode setting section 302 causes the semiconductor memory device to enter or exit from the target activation mode, in response to the preset command. The MRS mode setting section 304 causes the semiconductor memory device to enter or exit from the target activation mode, in response to the MRS setting.

The MRS setting means a setting of a mode register set (MRS), and a scheme used for setting an MRS in a general semiconductor memory device may be used as it is. That is, the MRS setting may be performed through the MRS setting code SETTING. The MRS setting code SETTING may be applied to the MRS mode setting section 304. Accordingly, the MRS mode setting section 304 performs an operation of determining whether or not to activate the mode enable signal TRR_EN and an operation of determining the value of the target address TRR_ADDR, for controlling entry into the target activation mode using the MRS setting code SETTING. The MRS mode setting section 304 performs the operation of determining whether or not to activate the mode enable signal TRR_EN and the operation of determining the value of the target address TRR_ADDR, in response to the MRS setting code SETTING, and performs an operation of determining whether or not to deactivate the mode enable signal TRR_EN, in response to the mode exit signal TRR_EXIT.

The preset command applied to the mode setting unit 300 means a separate command preset to control entry into the target activation mode, excluding various commands, such as a read command and a write command, which are generally applied to the semiconductor memory device. Of course, similar to the various commands, such as the read command and the write command, which are generally applied to the semiconductor memory device, the preset command is applied to the mode setting unit 300 through a path through which commands are inputted. The preset command is applied to the command mode setting section 302 between the component elements of the mode setting unit 300. The command mode setting section 302 performs an operation of determining whether or not to activate the mode enable signal TRR_EN, for controlling entry into the target activation mode using the preset command applied from the outside, and an operation of determining the value of the target address TRR_ADDR using the MRS setting code SETTING. That is, the command mode setting section 302 performs the operation of determining whether or not to activate the mode enable signal TRR_EN, in response to the preset command applied from the outside, performs the operation of determining the value of the target address using the MRS setting code SETTING, and performs an operation of determining whether or not to deactivate the mode enable signal TRR_EN, in response to the mode exit signal TRR_EXIT.

The address input unit 310 may buffer address signals ADDRs, which are applied from the outside, and generate the source address IN_ADDR. For reference, the source address IN_ADDR may include a plurality of bits, and the certain bits among the bits of the source address IN_ADDR may be applied to the mode setting unit 300 as the MRS setting code SETTING. Determination of the certain bits to be used as the MRS setting code SETTING among the bits of the source address IN_ADDR may be varied by a designer. The source address IN_ADDR applied to the address input unit 310 may be classified into the target address and a normal address as the value of the target address is determined by the mode setting unit 300 at a time point when entry is made to the target activation mode. That is, after the value of the target address is determined by the mode setting unit 300 at the time point when entry is made to the target active mode, the source address IN_ADDR may be an address corresponding to the value of the target address and an address irrelevant to the value of the target address.

The memory cell array 370 includes a plurality of word lines WL1, WL2 . . . WLK. The respective word lines WL1, WL2 . . . WLK may be independently selected based on the value of the source address IN_ADDR. For reference, the memory cell array 370 may include a plurality of banks and a plurality of bank groups. In such case, the source address IN_ADDR may include information for selecting the banks and the bank groups.

The row control unit 320 may sequentially activate and precharge a word line WLL corresponding to the target address TRR_ADDR and N number of word lines (e.g., WLL+1 and WLL−1) adjacent to the word line WLL corresponding to the target address TRR_ADDR among the word lines WL1, WL2 . . . WLK during the target activation mode. For reference, the number meant by N may be selected as other numbers that are natural numbers larger than 2, by a designer. Accordingly, the word lines WLL+1 and WLL−1 adjacent to the word line WLL corresponding to the target address TRR_ADDR mean two adjacent word lines WLL+1 and WLL−1 which are disposed physically adjacent to the word line WLL corresponding to the target address TRR_ADDR. Further, when N is '4', the N number of word lines WLL+1 and WLL−1 adjacent to the word line WLL corresponding to the target address TRR_ADDR mean four adjacent word lines WLL+2, WLL+1, WLL−1 and WLL−2, which are disposed physically adjacent to the word line WLL corresponding to the target address TRR_ADDR. The adjacent word lines WLL+1 and WLL−1 mean word lines, which are disposed physically adjacent to the word line WLL corresponding to the target address TRR_ADDR, and in which the data of the memory cells connected to the word lines are influenced by the repeated activation-precharge operations for the target word line WLL.

In detail, the row control unit 320 sequentially activates and precharges the target word line WLL' corresponding to the target address TRR_ADDR and the two adjacent word lines WLL+1 and WLL−1, which are disposed adjacent to the target word line WLL among the word lines WL1, WL2 . . . WLK, whenever an active command ACT_CMD and the target address TRR_ADDR are applied, during the target activation mode. That is, when the address with the value of the target address TRR_ADDR in the source address IN_ADDR is inputted through the address input unit 310, the row control unit 320 activates and precharges not only the target word line WLL but also the two adjacent word lines WLL+1 and WLL−1.

The operations for sequentially activating and precharging the target word line WLL and the two adjacent word lines WLL+1 and WLL−1 may be performed in a predetermined order in response to repeated application of the active command ACT_CMD and the target address TRR_ADDR from the outside. For instance, the operations may be performed in such a manner that the target word line WLL is first activated and precharged in response to the first application of the active command ACT_CMD and the target address TRR_ADDR, the adjacent word line WLL−1 is activated and precharged in response to the second application of the active command ACT_CMD and the target address TRR_ADDR, and the adjacent word line WLL+1 WLL is activated and precharged in response to the third application of the active command ACT_CMD and the target address TRR_ADDR.

The operations for sequentially activating and precharging the target word line WLL and the two adjacent word lines WLL+1 and WLL− may be performed in an automatically determined order after the active command ACT_CMD and the target address TRR_ADDR are first applied from the outside. For instance, the operations may be performed in such a manner that the target word line WLL is first activated and precharged in response to the first application of the active command ACT_CMD and the target address TRR_ADDR, the adjacent word line WLL−1 is activated and precharged in response to the precharge of the target word line WLL, and the adjacent word line WLL+1 is activated and precharged in response to the precharge of the word line WLL−1.

The row control unit 320 activates and precharges a normal word line WLNM corresponding to the normal address NM among the word lines WL1, WL2 . . . WLK, whenever the active command ACT_CMD and the normal address NM are applied, during the target activation mode. That is, when the address applied through the address input unit 310 during the target activation mode is the normal address NM, the row control unit 320 activates and precharges the normal word line WLNM aside from the target activating operation.

The row control unit 320 activates and precharges a word line corresponding to the source address IN_ADDR among the word lines WL1, WL2, . . . , WLK, each time the active command ACT_CMD and the source address IN_ADDR are applied after exiting from the target activation mode. That is, the row control unit 320 activates and precharges a word line corresponding to the corresponding source address IN_ADDR regardless of whether the address applied through the address input unit 310 has the value of the target address TRR_ADDR, after exiting from the target activation mode.

The mode exit control unit 340 may count the number of activation or activation-precharge operations by the row control unit 320 during the target activation mode and determine whether or not to activate the mode exit signal TRR_EXIT. That is, the mode exit control unit 340 activates the mode exit signal TRR_EXIT when a number acquired by counting the number of activation operations by the row control unit 320 during the target activation mode reaches a predetermined number, such that the mode setting unit 300 may deactivate the mode enable signal TRR_EN, thereby allowing the semiconductor memory device to exit from the target activation mode.

In detail, the mode exit control unit 340 does not count the number of all activation operations by the row control unit 320 during the target activation mode. That is, the mode exit control unit 340 only counts the number of the operations of activating and precharging the target word line WLL and the two adjacent word lines WLL+1 and WLL−1 by the row control unit 320 and does not count the number of the operations of activating and precharging the normal word line WLNM by the row control unit 320. While the mode exit control unit 340 distinctively counts the number of activation operations of the row control unit 320, the mode exit control unit 340 activates the mode exit signal TRR_EXIT when the counted number of times reaches 3. Since the row control unit 320 sequentially activates and precharges the target word line WLL and the two adjacent word lines WLL+1 and WLL−1, the mode exit control unit 340 detects whether the row control unit 320 has activated and precharged, each of the target word line WLL and the two adjacent word lines WLL+1 and WLL−1, and determines whether to activate the mode exit signal TRR_EXIT.

The target address latch 330 may store the target address TRR_ADDR during the target activation mode. The target address TRR_ADDR stored in the target address latch 330 is the value of the target address, which is generated by the mode setting unit 300.

The address determination unit 350 may compare the value of the target address TRR_ADDR stored in the target address latch 330 and the value of the source address IN_ADDR during the target activation mode, and determines whether the source address IN_ADDR has the value of the target address TRR_ADDR. A result ACT_TRR acquired by determining whether the source address IN_ADDR has the value of the target address TRR_ADDR, through the address determination unit 350, may control the operations of the mode exit control unit 340.

The source address latch 380 may store the source address IN_ADDR applied from the address input unit 310. The source address IN_ADDR stored in the source address latch 380 is transferred to the address determination unit 350 and the row control unit 320.

The refresh operation control unit 360 may control the row control unit 320 for a general refresh operation based on a refresh command REF_CMD and the mode enable signal TRR_EN. According to the operation or the type of the semiconductor memory device, it may be possible that the source address IN_ADDR stored in the source address latch 380 is used as a refresh address. In such case, if the use of the source address IN_ADDR as a refresh address is not limited during the target activation mode, the target activating operation may not be normally performed. For example, since a general refresh operation may be set to have a higher priority than the target activating operation, the source address IN_ADDR stored in the source address latch 380 may not be used in the target activating operation, but may be used in the general refresh operation, thus the target activating operation may not be normally performed.

Accordingly, the refresh operation control unit 360, as a component element needed in a semiconductor memory device using the source address IN_ADDR stored in the source address latch 380 as a refresh address, may prevent the general refresh operation from being performed during the target activation mode. That is, the refresh operation control unit 360 may be omitted in a semiconductor memory device, which does not use the source address IN_ADDR stored in the source address latch 380 as a refresh address.

Figure 4:
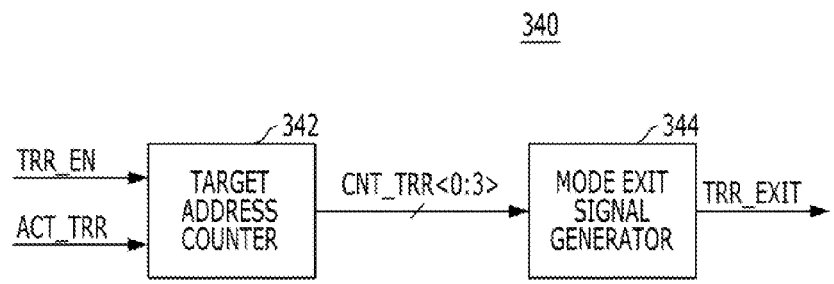
FIG. 4 is a detailed diagram illustrating a mode exit control unit shown in FIG. 3.

FIG. 4 is a detailed diagram illustrating the mode exit control unit 340 shown in FIG. 3.

Referring to FIG. 4, the mode exit control unit 340 may include a target address counter 342 and a mode exit signal generator 344.

The target address counter 342 may count the number of times in which the value of the source address IN_ADDR has the value of the target address TRR_ADDR during the target activation mode. That is, the target address counter 342 performs a counting operation when the output signal ACT_TRR of the address determination unit 350 is activated and the source address IN_ADDR applied through the address input unit 310 is determined to have the value of the target address TRR_ADDR, during the period in which the mode enable signal TRR_EN is activated and the target activation mode is entered.

The mode exit signal generator 344 may activate the mode exit signal TRR_EXIT when the number of times counted by the target address counter 342 reaches 3. It may be seen that, while the number of times to be counted by the target address counter 342 is only 3, a counting signal CNT_TRR<0:3> to be outputted from the target address counter 342 is a 4-bit signal. In order not to add a separate decoding circuit between the target address counter 342 and the mode exit control unit 340, the respective bits of the counting signal CNT_TRR<0: 3> may be sequentially activated one by one. For instance, in the initializing operation of the target address counter 342, which is performed in the target activating operation, an initializing bit CNT_TRR<0> of the counting signal CNT_TRR<0:3> is activated, and the remaining bits CNT_TRR<1:3> retain a deactivated state. Then, only the first bit CNT_TRR<1> of the counting signal CNT_TRR<0: 3> is activated, and the remaining bits CNT_TRR<0> and CNT_TRR<2:3> designate a deactivated state. Then, only the second bit CNT_TRR<2> of the counting signal CNT_TRR<0:3> is activated, and the remaining bits CNT_TRR<0:1> and CNT_TRR<3> designate a deactivated state. Then, only the third bit CNT_TRR<3> of the counting signal CNT_TRR<0:3> is activated, and the remaining bits CNT_TRR<0:2> designate a deactivated state. In response to the activation of the third bit CNT_TRR<3> of the counting signal CNT_TRR<0:3>, the mode exit signal TRR_EXIT is activated such that all the bits of the counting signal CNT_TRR<0:3> are deactivated. In such case, the mode exit signal generator 344 may activate the mode exit signal TRR_EXIT when only the last bit CNT_TRR<3> of the counting signal CNT_TRR<0:3> is activated.

If a separate decoding circuit is added between the target address counter 342 and the mode exit control unit 340, a signal to be outputted from the target address counter 342 may be a signal with a smaller number of bits.

Figure 5:
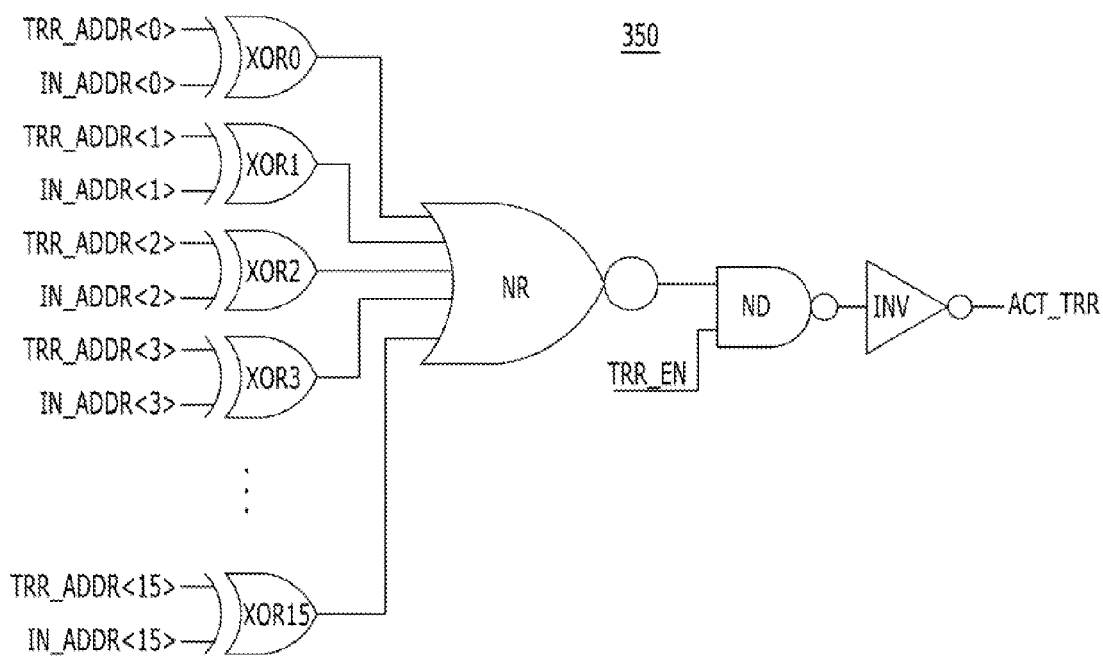
FIG. 5 is a detailed diagram illustrating an address determination unit shown in FIG. 3.

FIG. 5 is a detailed diagram illustrating the address determination unit 350 shown in FIG. 3.

Referring to FIG. 5, the address determination unit 350 uses a scheme of one-to-one comparing the values of respective bits <0:15> of the source address IN_ADDR and the values of respective bits <0:15> of the target address TRR_ADDR stored in the target address latch 330.

In detail, the address determination unit 350 includes a plurality of exclusive OR gates XOR<0:15> for exclusively ORing the respective bits <0:15> of the source address IN_ADDR and the respective bits <0:15> of the target address TRR_ADDR stored in the target address latch 330, a NOR gate NR for NORing all of the output signals of the exclusive OR gates XOR<0:15>, and a NAND gate NAND and an inverter INV for outputting the output signal of the NOR gate NR as the output signal ACT_TRR of the address determination unit 350 only during the period in which the mode enable signal TRR_EN is activated to a logic high level.

Observing operations of the address determination unit 350, when all of the respective bits <0:15> of the source address IN_ADDR and the respective bits <0:15> of the target address TRR_ADDR stored in the target address latch 330 have precisely the same logic values, all of the output signals of the exclusive OR gates XOR<0:15> become logic low levels and the output signal of the NOR gate NR becomes a logic high level, accordingly, the output signal ACT_TRR of the address determination unit 350 is activated to a logic high level. Conversely, when the respective bits <0:15> of the source address IN_ADDR and the respective bits <0:15> of the target address TRR_ADDR stored in the target address latch 330 have logic values that do not correspond to each other in any one bit, the signal outputted from at least any one exclusive OR gate among the exclusive OR gates XOR<0: 15> becomes a logic high level and the output signal of the NOR gate NR becomes a logic low level, accordingly, the output signal ACT_TRR of the address determination unit 350 is deactivated to a logic low level.

Figure 6:
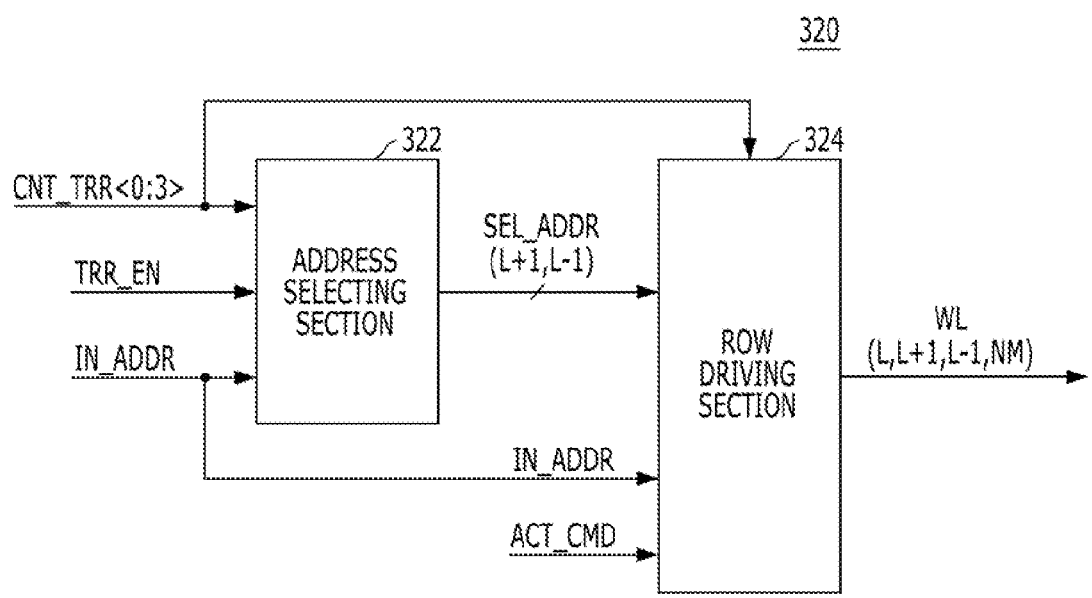
FIG. 6 is a detailed diagram illustrating a row control unit shown in FIG. 3.

FIG. 6 is a detailed diagram illustrating the row control unit 320 shown in FIG. 3.

Referring to FIG. 6, the row control unit 320 may include an address selecting section 322 and a row driving section 324.

The address selecting section 322 may select two selection addresses SEL_ADDR (i.e., L+1 and L−1) with adjacent values when viewed in both sides from the value L of the source address IN_ADDR, when the value of the source address IN_ADDR corresponds to the value L of the target address TRR_ADDR during the target activation mode.

In detail, the address selecting section 322 may perform an operation of selecting an address only during the target activation mode in which the mode enable signal TRR_EN is activated.

In another embodiment, the address selecting section 322 may be directly applied with the signal ACT_TRR from the address determination unit 350 and may determine whether the value of the source address IN_ADDR has the value of the target address TRR_ADDR. However, in FIG. 6, the address selecting section 322 is applied with the counting signal CNT_TRR<0:3> outputted from the target address counter 342, and determines whether the value of the source address IN_ADDR has the value of the target address TRR_ADDR. It may be possible to determine whether the value of the source address IN_ADDR has the value of the target address TRR_ADDR, by being applied with the counting signal CNT_TRR<0:3> outputted from the target address counter 342 instead of being directly applied with the signal ACT_TRR from the address determination unit 350. This is because the counting signal CNT_TRR<0:3> outputted from the target address counter 342 is a signal, which is generated in response to the signal ACT_TRR of the address determination unit 350.

Since the address selecting section 322 performs the operation of selecting an address only when the value of the source address IN_ADDR has the value of the target address TRR_ADDR in response to the counting signal CNT_TRR<0:3>, the source address IN_ADDR which is applied at the time point when the address selecting section 322 performs the operation of selecting an address has the value L of the target address TRR_ADDR. Accordingly, the address selecting section 322 may sequentially select the two selection addresses L+1 and L−1 with adjacent values when viewed in both sides from the value L of the source address IN_ADDR.

The row driving section 324 may activate and precharge a word line corresponding to the source address IN_ADDR among the word lines WL1, WL2 ... WLK in response to the active command ACT_CMD. Therefore, a basic operation of the row driving section 324 is to activate and precharge a word line corresponding to the source address IN_ADDR, which does not have the value of the target address TRR_ADDR (i.e., the normal word line WLNM), in response to the active command ACT_CMD, even during the target activation mode in which the address selecting section 322 operates.

When the source address IN_ADDR with the value of the target address TRR_ADDR and the active command ACT_CMD are applied together during the target activation mode, the row driving section 324 not only activates and precharges the target word line WLL but also activates and precharges the two adjacent word lines WLL+1 and WLL−1, which correspond to the two selection addresses L+1 and L−1 selected by the address selecting section 322.

In detail, the row driving section 324 may activate and precharge the two adjacent word lines WLL+1 and WLL−1 during the target activation mode by using a method of activating and precharging them in response to the active command ACT_CMD or a method of activating and precharging them regardless of the active command ACT_CMD.

First, the row driving section 324 may activate and precharge the target word line WLL and the two adjacent word lines WLL+1 and WLL−1 during the target activation mode by using a method of sequentially activating and precharging the target word line WLL and the two adjacent word lines WLL+1 and WLL−1 whenever the source address IN_ADDR with the value of the target address TRR_ADDR is applied together with the active command ACT_CMD. For instance, when the source address IN_ADDR with the value of the target address TRR_ADDR is first applied together with the active command ACT_CMD, the row driving section 324 activates and precharges the target word line WLL. While the row driving section 324 performs the operations of activating and precharging the target word line WLL, the address selecting section 322 selects the two selection addresses L+1 and L−1 on the basis of the value L of the source address IN_ADDR. When the source address IN_ADDR with the value of the target address TRR_ADDR is second applied together with the active command ACT_CMD after the target word line WLL is precharged, the row driving section 324 activates and precharges the word line WLL+1 or WLL−1 corresponding to any one address L+1 or L−1 between the two selection addresses L+1 and L−1 selected by the address selecting section 322. When the source address IN_ADDR with the value of the target address TRR_ADDR is applied together with the active command ACT_CMD after the word line activated immediately before is precharged, the row driving section 324 activates and precharges the word line WLL+1 or WLL−1 corresponding to the address, which is not used yet in the activating and precharging operations between the two selection addresses L+1 and L−1 selected by the address selecting section 322. In this method, when the source address IN_ADDR irrelevant to the value of the target address TRR_ADDR is applied together with the active command ACT_CMD intermediately in the state in which activation and precharge of the two selection addresses L+1 and L−1 selected by the address selecting section 322 are not completed, it may be possible to immediately activate and precharge the normal word line WLNM corresponding to the source address IN_ADDR irrelevant to the value of the target address TRR_ADDR.

Second, the row driving section 324 may activate and precharge the target word line WLL and the two adjacent word lines WLL+1 and WLL−1 during the target activation mode regardless of the active command ACT_CMD by using a method of starting by activating and precharging the target word line WLL when the source address IN_ADDR with the value of the target address TRR_ADDR is first applied together with the active command ACT_CMD and then sequentially activating and precharging the two adjacent word lines WLL+1 and WLL−1. For instance, when the source address IN_ADDR with the value of the target address TRR_ADDR is first applied together with the active command ACT_CMD, the row driving section 324 activates and precharges the target word line WLL. While the row driving section 324 performs the operations of activating and precharging the target word line WLL, the address selecting section 322 selects the two selection addresses L+1 and L−1 on the basis of the value L of the source address IN_ADDR. Then, when the target word line WLL is precharged, the row driving section 324 activates and precharges the word line WLL+1 or WLL−1 corresponding to any one address L+1 or L−1 between the two selection addresses L+1 and L−1 selected by the address selecting section 322. When the word line activated immediately before is precharged, the row driving section 324 consecutively activates and precharges the word line WLL+1 or WLL−1 corresponding to the address, which is not used yet in the activating and precharging operations between the two selection addresses L+1 and L−1 selected by the address selecting section 322. In this method, the source address IN_ADDR may not be applied together with the active command ACT_CMD intermediately in the state in which activation and precharge of the two selection addresses L+1 and L−1 selected by the address selecting section 322 are not completed. That is, after the target activation mode is entered, sufficient time to activate and precharge all of the target word line WLL and the two adjacent word lines WLL+1 and WLL−1 should be consecutively ensured.

In the semiconductor memory device in accordance with an embodiment of the present invention, a method for selecting any one word line among the word lines WL1, WL2 ... WLK using the target address TRR_ADDR is described. However, if a plurality of banks and a plurality of bank groups are included in the memory cell array 370, a method for selecting any one bank among the banks using the target address TRR_ADDR may be used. For instance, a method for selecting a target bank by comparing the bank select information included in the source address IN_ADDR and the target address TRR_ADDR including only bank select information may be used. This is because when a frequency of access to any one bank among the banks is high, the probability of the presence of a target word line in the bank becomes high. Therefore, even when selection may be made to any one bank with a high access frequency among the banks, it may be possible to select a target word line with a large number of activation times (or a high activation frequency).

Figure 7:
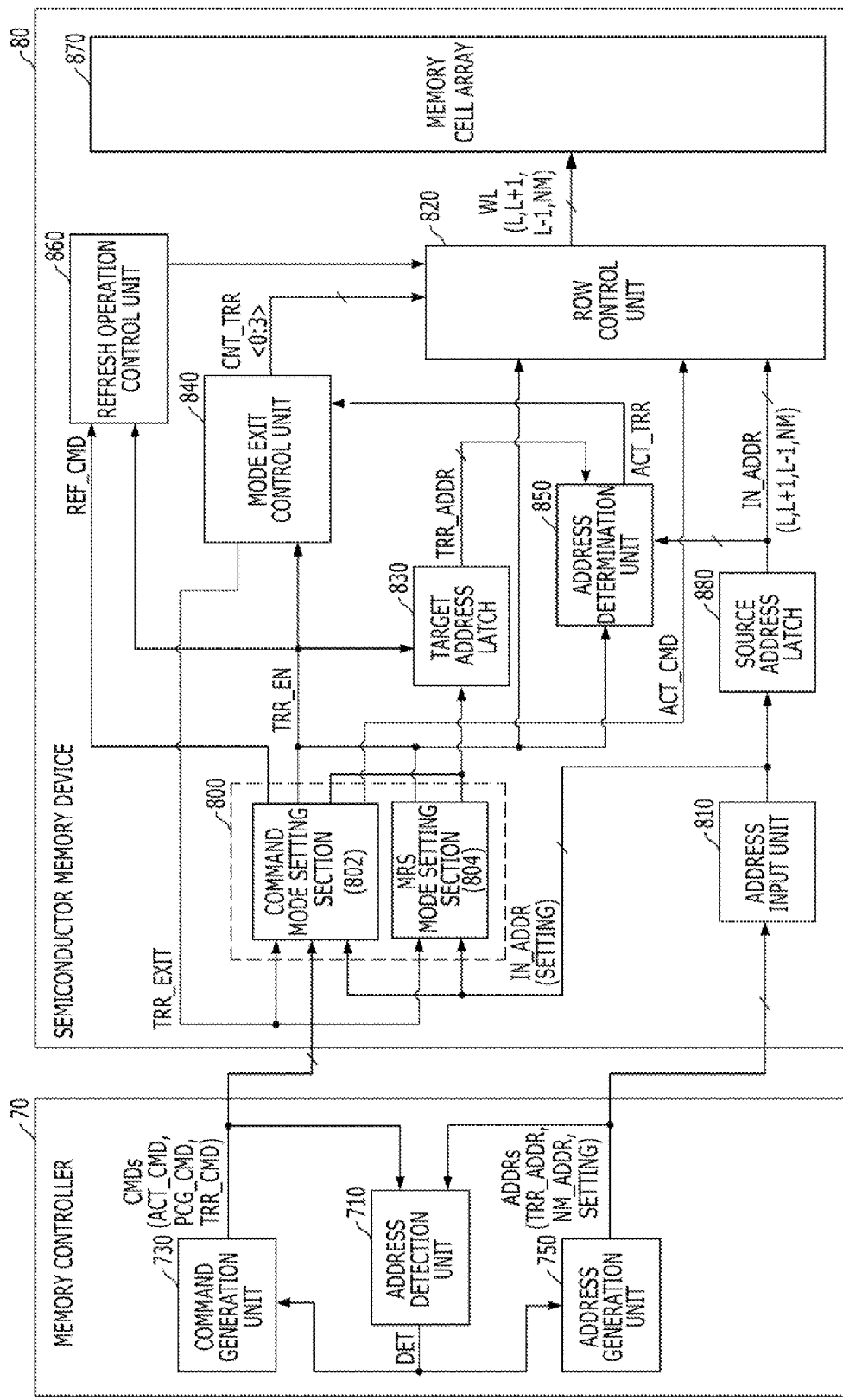
FIG. 7 is a block diagram illustrating a memory system in accordance with an embodiment of the present invention.

FIG. 7 is a block diagram illustrating a memory system in accordance with an embodiment of the present invention.

Referring to FIG. 7, the memory system includes a semiconductor memory device 80 and a memory controller 70. The memory controller 70 may include an address detection unit 710, a command generation unit 730, and an address generation unit 750. The semiconductor memory device 80 may include a memory cell array 870, a mode setting unit 800, an address input unit 810, a row control unit 820, a target address latch 830, a mode exit control unit 840, an address determination unit 850, a refresh operation control unit 860, and a source address latch 880. The mode setting unit 800 includes a command mode setting section 802 and/or an MRS mode setting section 804.

For reference, while not shown in detail in FIG. 7, as shown in FIG. 3, the memory cell array 870 includes a plurality of word lines WL1, WL2 . . . WLK. The word lines WL1, WL2 . . . WLK may be respectively selected based on the value of a source address IN_ADDR. In addition, the memory cell array 870 may include a plurality of banks and a plurality of bank groups. In such case, the source address IN_ADDR may include information for selecting the banks and the bank groups.

The memory controller 70 may generate command signals CMDs and address signals ADDRs to control operations for activating and precharging the respective word lines WL1, WL2 . . . WLK included in the semiconductor memory device 80. In detail, the memory controller 70 generates an MRS setting code SETTING or a target activation command TRR_CMD and transmits the MRS setting code SETTING or the target activation command TRR_CMD to the semiconductor memory device 80, for entry into a target activation mode, generates active and precharge commands and transmits the active and precharge commands to the semiconductor memory device 80, for performing activation or activation-precharge operations, and transmits the source address IN_ADDR, for respectively selecting the word lines WL1, WL2 . . . WLK. The source address IN_ADDR transmitted by the memory controller 70 to the semiconductor memory device 80 may be classified as a target address TRR_ADDR of which activation or activation-precharge history satisfies a predetermined condition and a normal address NM of which activation (or activation-precharge) history does not satisfy the predetermined condition. Regardless of that the source address IN_ADDR is classified as the target address TRR_ADDR or the normal address NM, the source address IN_ADDR may be transmitted to the semiconductor memory device 80 in the same manner. In this case, information on the value of the source address IN_ADDR classified as the target address TRR_ADDR is transmitted to the semiconductor memory device 80. The MRS setting code SETTING means a signal for setting the mode register set (MRS) of the semiconductor memory device 80, and is generally transmitted through a path through which the source address IN_ADDR is transmitted. Unlike the illustration of FIG. 7, a separate path for transmitting the MRS setting code SETTING may be added between the memory controller 70 and the semiconductor memory device 80. The MRS setting code SETTING for setting the mode register set may include the information on the value of the source address IN_ADDR classified as the target address TRR_ADDR. That is, the information on the value of the source address IN_ADDR classified as the target address TRR_ADDR is transmitted to the semiconductor memory device 80 at a time point different from a time point at which the general source address IN_ADDR is transmitted.

Among the component elements of the memory controller 70, the address detection unit 710 may detect as a signal DET the source address IN_ADDR as the target address TRR_ADDR when the number of times in which the source address IN_ADDR is transmitted to the semiconductor memory device 80 together with an active command ACT_CMD is at least a reference number of times, and detect as a signal DET the source address IN_ADDR as the normal address NM when the number of times in which the source address IN_ADDR is transmitted to the semiconductor memory device 80 together with the active command ACT_CMD is less than the reference number of times. The detection information DET on the source address IN_ADDR detected by the address detection unit 710 is transmitted to the command generation unit 730 and the address generation unit 750 to affect operations of the command generation unit 730 and the address generation unit 750.

The command generation unit 730 may not only generate the active command ACT_CMD and a precharge command PRE_CMD, but also may generate a target activation command TRR_CMD based on the output signal DET of the address detection unit 710. The command generation unit 730 not only generates the active command ACT_CMD and the precharge command PRE_CMD for controlling the activation-precharge operations of the semiconductor memory device 80, but also generates the target activation command TRR_CMD for controlling entry into the target activation mode according to the result DET of the address detection unit 710. For reference, the active command ACT_CMD and the precharge command PRE_CMD are generated by being bundled for example in a set. When a predetermined time passes after the active command ACT_CMD is generated, the precharge command PRE_CMD is automatically generated. That is, control is made in such a manner that, when a predetermined time passes after any one word line among the word lines WL1, WL2 . . . WLK included in the semiconductor memory device 80 is activated, the activated word line is precharged.

The address generation unit 750 may not only generate the source address IN_ADDR, but also generate the MRS setting code SETTING based on the output signal DET of the address detection unit 710. That is, the address generation unit 750 not only generates the source address IN_ADDR for selecting the respective word lines WL1, WL2 . . . WLK included in the semiconductor memory device 80, but also generates the MRS setting code SETTING for controlling entry into the target activation mode according to the result DET of the address detection unit 710. The source address IN_ADDR is generally generated at a time when the active command ACT_CMD is generated. The source address IN_ADDR is transmitted together with the active command ACT_CMD to the semiconductor memory device 80. The MRS setting code SETTING is generated at an independent time, which may be set by a designer regardless of the time when the active command ACT_CMD is generated.

The semiconductor memory device 80 may enter the target activation mode in response to the MRS setting code SETTING or the target activation command TRR_CMD applied from the memory controller 70, sequentially activate and precharge a target word line WLL and two adjacent word lines WLL+1 and WLL−1 during the target activation mode, and exit from the target activation mode by counting the number of activation operations.

In the semiconductor memory device 80, the mode setting unit 800 may set the semiconductor memory device 80 to enter the target activation mode, in response to the MRS setting code SETTING or the target activation command TRR_CMD, and set the semiconductor memory device 80 to exit from the target activation mode, in response to a mode exit signal TRR_EXIT. The mode setting unit 800 sets the value of the target address TRR_ADDR.

In detail, the mode setting unit 800 causes the semiconductor memory device 80 to enter the target activation mode, by activating a mode enable signal TRR_EN in response to the MRS setting code SETTING or the target activation command TRR_CMD. The mode setting unit 800 causes the semiconductor memory device 80 to exit from the target activation mode, by deactivating the mode enable signal TRR_EN in response to activation of the mode exit signal TRR_EXIT. Moreover, the mode setting unit 800 sets the value of the target address TRR_ADDR by being inputted with an optional signal representing the value of the target address TRR_ADDR. For example, the mode setting unit 800 determines the value of the target address TRR_ADDR by being inputted with a partial setting code SETTING of the source address IN_ADDR, which is applied through the address input unit 810 from the memory controller 70.

That is, during the target activation mode, the mode enable signal TRR_EN maintains an activated state. Conversely, after exiting from the target activation mode the mode enable signal TRR_EN maintains a deactivated state. Even when the target activation mode is entered, general operations of the semiconductor memory device 80 may be performed. That is, even when the target activation mode is entered, the general operations of the semiconductor memory device 80 such as data reading/writing may be performed without limit. This is because, when the source address IN_ADDR applied through the address input unit 810 does not have the value of the target address TRR_ADDR during the target activation mode, the row control unit 820 may not perform the target activating operation.

The mode setting unit 800 includes the command mode setting section 802 and/or the MRS mode setting section 804. That is, the mode setting unit 800 may include only the command mode setting section 802, may include only the MRS mode setting section 804, or may include both the command mode setting section 802 and the MRS mode setting section 804. The command mode setting section 802 causes the semiconductor memory device 80 to enter/exit from the target activation mode, in response to the target activation command TRR_CMD. The MRS mode setting section 804 causes the semiconductor memory device 80 to enter or exit from the target activation mode, in response to the MRS setting code SETTING.

The MRS mode setting section 804 performs an operation of determining whether or not to activate the mode enable signal TRR_EN and an operation of determining the value of the target address TRR_ADDR, for controlling entry into the target activation mode using the MRS setting code SETTING, which corresponds to certain bits of the source address IN_ADDR applied through the address input unit 810. The MRS mode setting section 804 performs the operation of determining whether or not to activate the mode enable signal TRR_EN and the operation of determining the value of the target address TRR_ADDR, in response to the MRS setting code SETTING of the source address IN_ADDR applied through the address input unit 810, and performs an operation of determining whether or not to deactivate the mode enable signal TRR_EN, in response to the mode exit signal TRR_EXIT.

The command mode setting section 802 performs an operation of determining whether or not to activate the mode enable signal TRR_EN, for controlling entry into the target activation mode using the target activation command TRR_CMD applied from the memory controller 70, and an operation of determining the value of the target address TRR_ADDR using the MRS setting code SETTING. That is, the command mode setting section 802 performs the operation of determining whether or not to activate the mode enable signal TRR_EN, in response to the target activation command TRR_CMD, performs the operation of determining the value of the target address TRR_ADDR using the MRS setting code SETTING, and performs an operation of determining whether or not to deactivate the mode enable signal TRR_EN, in response to the mode exit signal TRR_EXIT.

The address input unit 810 may buffer address signals ADDRs, which are applied from the memory controller 70, and generate the source address IN_ADDR. For reference, the source address IN_ADDR may include a plurality of bits, and certain bits among the bits of the source address IN_ADDR may be applied to the mode setting unit 800 as the MRS setting code SETTING. Determination of the certain bits to be used as the MRS setting code SETTING among the bits of the source address IN_ADDR may be varied by a designer.

The row control unit 820 may sequentially activate and precharge the target word line WLL and the two adjacent word lines WLL+1 and WLL−1 during the target activation mode.

In detail, the row control unit 820 sequentially activates and precharges the target word line WLL and the two adjacent word lines WLL+1 and WLL−1, whenever the active command ACT_CMD and the target address TRR_ADDR are applied, during the target activation mode. When the address with the value of the target address TRR_ADDR in the source address IN_ADDR is inputted through the address input unit 810, the row control unit 820 sequentially activates and precharges not only the target word line WLL but also the two adjacent word lines WLL+1 and WLL−1.

The operations for sequentially activating and precharging the target word line WLL and the two adjacent word lines WLL+1 and WLL−1 may be performed in a predetermined order in response to repeated application of the active command ACT_CMD and the target address TRR_ADDR from the memory controller 70. For instance, the operations may be performed in such a manner that the target word line WLL is first activated and precharged in response to the first application of the active command ACT_CMD and the target address TRR_ADDR, the adjacent word line WLL−1 is activated and precharged in response to the second application of the active command ACT_CMD and the target address TRR_ADDR, and the adjacent word line WLL+1 is activated and precharged in response to the third application of the active command ACT_CMD and the target address TRR_ADDR.

The operations for sequentially activating and precharging the target word line WLL and the two adjacent word lines WLL+1 and WLL−1 may be performed in an automatically determined order after the active command ACT_CMD and the target address TRR_ADDR are first applied from the memory controller 70. For instance, the operations may be performed in such a manner that the target word line WLL is first activated and precharged in response to the first application of the active command ACT_CMD and the target address TRR_ADDR, the adjacent word line WLL−1 is activated and precharged in response to the precharge of the target word line WLL, and the adjacent word line WLL+1 is activated and precharged in response to the precharge of the word line WLL−1.

The row control unit 820 activates and precharges a normal word line WLNM among the word lines WL1, WL2 ... WLK, whenever the active command ACT_CMD and the normal address NM are applied, during the target activation mode. When the address applied through the address input unit 810 during the target activation mode is the normal address NM, the row control unit 820 activates and precharges the normal word line WLNM aside from the target activating operation.

The row control unit 820 activates and precharges a word line corresponding to the source address IN_ADDR among the word lines WL1, WL2 ... WLK, whenever the active command ACT_CMD and the source address IN_ADDR are applied after exiting from the target activation mode. The row control unit 820 activates and precharges a word line corresponding to the corresponding source address IN_ADDR regardless of whether the address applied through the address input unit 810 has the value of the target address TRR_ADDR, after exiting from the target activation mode.

The mode exit control unit 840 may count the number of activation (or activation-precharge) operations by the row control unit 820 during the target activation mode and determine whether or not to activate the mode exit signal TRR_EXIT. That is, the mode exit control unit 840 activates the mode exit control unit 840 when a number acquired by counting the number of activation operations by the row control unit 820 during the target activation mode reaches a predetermined number, such that the mode setting unit 800 may deactivate the mode enable signal TRR_EN, thereby allowing the semiconductor memory device 80 to exit from the target activation mode.

In detail, the mode exit control unit 840 does not count the number of all activation operations by the row control unit 820 during the target activation mode. That is, the mode exit control unit 840 only counts the number of the operations of activating and precharging the target word line WLL and the two adjacent word lines WLL+1 and WLL−1 by the row control unit 820 and does not count the number of the operations of activating and precharging the normal word line WLNM by the row control unit 820. While the mode exit control unit 840 distinctively counts the number of activation operations of the row control unit 820, the mode exit control unit 840 activates the mode exit signal TRR_EXIT when the counted number of times reaches 3. Since the row control unit 820 sequentially activates and precharges the target word line WLL and the two adjacent word lines WLL+1 and WLL−1, the mode exit control unit 840 detects whether the row control unit 820 has activated and precharged each of the target word line WLL and the two adjacent word lines WLL+1 and WLL−1, and determines whether to activate the mode exit signal TRR_EXIT.

The target address latch 830 may store the target address TRR_ADDR during the target activation mode. The target address TRR_ADDR stored in the target address latch 830 is the value of the target address, which is generated by the mode setting unit 800.

The address determination unit 850 may compare the value of the target address TRR_ADDR stored in the target address latch 830 and the value of the source address IN_ADDR, during the target activation mode, and determines whether the source address IN_ADDR has the value of the target address TRR_ADDR. A result ACT_TRR acquired by determining whether the source address IN_ADDR has the value of the target address TRR_ADDR, through the address determination unit 850, may control the operations of the mode exit control unit 840.

The source address latch 880 is may store the source address IN_ADDR applied through the address input unit 810. The source address IN_ADDR stored in the source address latch 880 is transferred to the address determination unit 850 and the row control unit 820.

The refresh operation control unit 860 may control the row control unit 820 for a general refresh operation based on a refresh command REF_CMD and the mode enable signal TRR_EN. According to the operation or the type of the semiconductor memory device 80, it may be possible that the source address IN_ADDR stored in the source address latch 880 is used as a refresh address. In such case, if the use of the source address IN_ADDR as a refresh address is not limited during the target activation mode, the target activating operation may not be normally performed. For example, since a general refresh operation may be set to have a higher priority than the target activating operation, the source address IN_ADDR stored in the source address latch 880 may not be used in the target activating operation, but may be used in the general refresh operation, and thus the target activating operation may not be normally performed.

Accordingly, the refresh operation control unit 860, as a component element needed in a semiconductor memory device using the source address IN_ADDR stored in the source address latch 880 as a refresh address, may prevent the general refresh operation from being performed during the target activation mode. That is, the refresh operation control unit 860 may be omitted in a semiconductor memory device, which does not use the source address IN_ADDR stored in the source address latch 880 as a refresh address.

Figure 8:
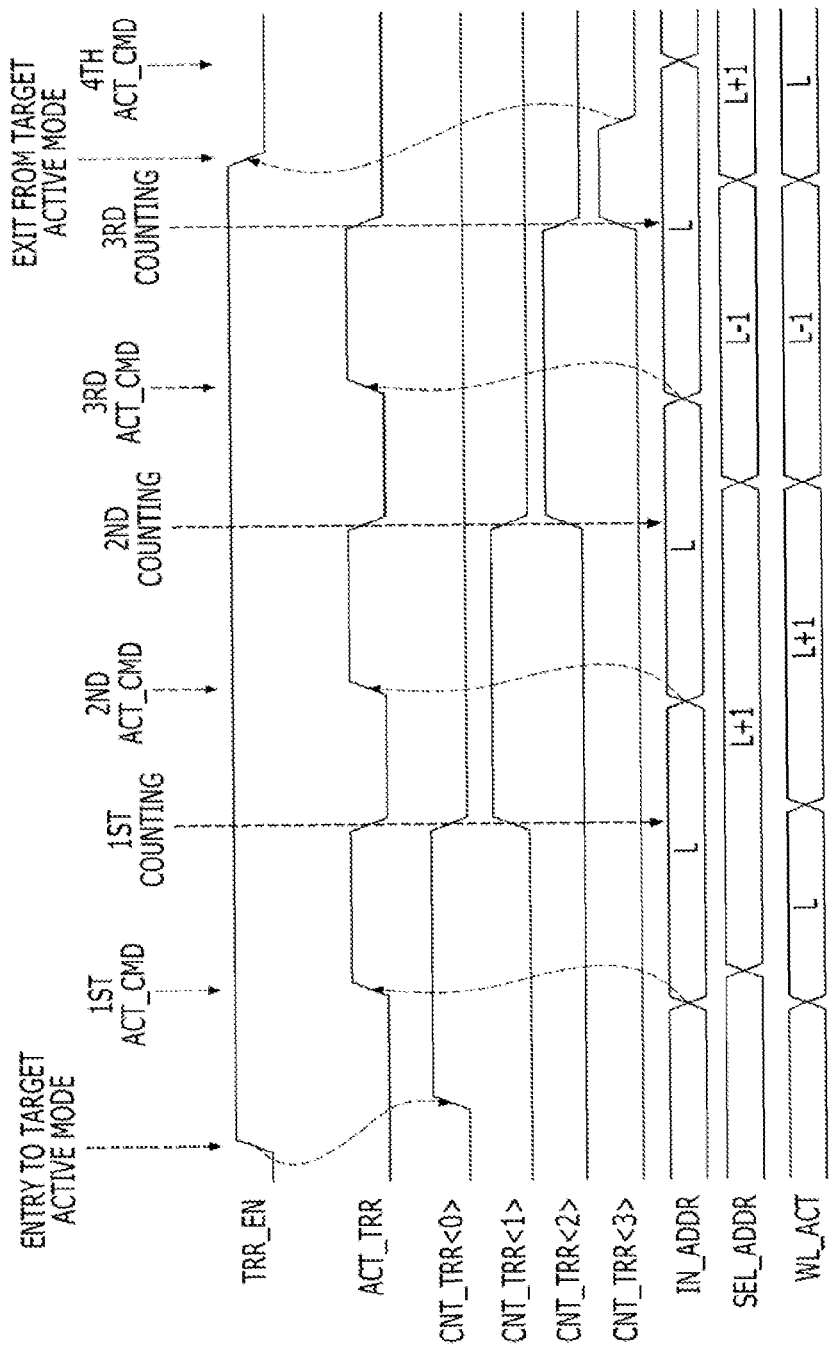
FIG. 8 is a timing diagram describing an operation of a semiconductor memory device in accordance with an embodiment of the present invention.

FIG. 8 is a timing diagram describing an operation of a semiconductor memory device in accordance with an embodiment of the present invention.

Referring to FIG. 8, the semiconductor memory device enters the target activation mode when the mode enable signal TRR_EN is activated at a logic high level by the MRS setting or the preset command. As the target activation mode is entered, the initializing bit CNT_TRR<0> of the counting signal CNT_TRR<0:3> outputted from the target address counter 342 is activated at a logic high level.

After the target activation mode is entered, the output signal ACT_TRR of the address determination unit 350 and 850 is activated from a logic low level at a logic high level whenever the source address IN_ADDR applied together with the active command ACT_CMD has the value L of the target address TRR_ADDR. When the output signal ACT_TRR of the address determination unit 350 and 850 is activated to the logic high level, the first bit CNT_TRR<1>, the second bit CNT_TRR<2> and the third bit CNT_TRR<3> of the counting signal CNT_TRR<0:3> outputted from the target address counter 342 are sequentially activated. As the first bit CNT_TRR<1>, the second bit CNT_TRR<2> and the third bit CNT_TRR<3> of the counting signal CNT_TRR<0:3> are sequentially activated, the target word line WLL and the two adjacent word lines WLL+1 and WLL−1 are sequentially activated and precharged.

In detail, since the source address IN_ADDR has the value L of the target address TRR_ADDR when a first active command 1ST ACT_CMD is applied, the target word line WLL is activated and precharged. During the period in which the target word line WLL is activated and precharged, the address selecting section 322 selects one address L+1 between the two selection addresses SEL_ADDR (i.e., L+1 and L−1) adjacent to the value L of the target address TRR_ADDR. In response to that, the source address IN_ADDR has the value L of the target address TRR_ADDR when the first active command 1ST ACT_CMD is applied, the output signal ACT_TRR of the address determination unit 350 and 850 is activated from the logic low level to the logic high level, accordingly, the initializing bit CNT_TRR<0> of the counting signal CNT_TRR<0:3> outputted from the target address counter 342 is deactivated at a logic low level and the first bit CNT_TRR<1> of the counting signal CNT_TRR<0:3> is activated at a logic high level. The output signal ACT_TRR of the address determination unit 350 and 850, which is activated to the logic high level, is deactivated to the logic low level at the time point when the input of the first active command 1ST ACT_CMD ends.

Since the source address IN_ADDR has the value L of the target address TRR_ADDR when a second active command 2ND ACT_CMD is applied, the adjacent word line WLL+1 corresponding to the address L+1 selected by the address selecting section 322 while the target address TRR_ADDR is activated and precharged in response to the first active command 1ST ACT_CMD, is activated and precharged. During the period in which the first adjacent word line WLL+1 adjacent to the target word line WLL is activated and precharged, the address selecting section 322 selects the remaining one address L−1 not selected between the two selection addresses L+1 and L−1 adjacent to the value L of the target address TRR_ADDR. In response to that the source address IN_ADDR has the value L of the target address TRR_ADDR when the second active command 2ND ACT_CMD is applied, the output signal ACT_TRR of the address determination unit 350 and 850 is activated from the logic low level to the logic high level, accordingly, the first bit CNT_TRR<1> of the counting signal CNT_TRR<0:3> outputted from the target address counter 342 is deactivated at a logic low level and the second bit CNT_TRR<2> of the counting signal CNT_TRR<0:3> is activated at a logic high level. The output signal ACT_TRR of the address determination unit 350 and 850, which is activated to the logic high level, is deactivated to the logic low level at the time point when the input of the second active command 2ND ACT_CMD ends.

Since the source address IN_ADDR has the value L of the target address TRR_ADDR when a third active command 3RD ACT_CMD is applied, the adjacent word line WLL−1 corresponding to the address L−1 selected by the address selecting section 322 while the first adjacent word line WLL+1 adjacent to the target address TRR_ADDR is activated and precharged in response to the second active command 2ND ACT_CMD, is activated and precharged. During the period in which the second adjacent word line WLL−1 adjacent to the target word line WLL is activated and precharged, the address selecting section 322 selects the remaining one address L+1 not selected between the two selection addresses L+1 and L−1 adjacent to the value L of the target address TRR_ADDR. For reference, while it may be seen that the address L+1 selected by the address selecting section 322 corresponds to the address L+1, which is already selected while the target word line WLL is activated and precharged in response to the first active command 1ST ACT_CMD, this occurs because the number of addresses capable of being selected by the address selecting section 322 is only 2 and thus there is no additional address to be selected. In such case, the selected address has no substantial meaning since it is not used to activate and precharge a word line after exiting from the target activation mode. In response to that the source address IN_ADDR has the value L of the target address TRR_ADDR when the third active command 3RD ACT_CMD is applied, the output signal ACT_TRR of the address determination unit 350 and 850 is activated from the logic low level to the logic high level, accordingly, the second bit CNT_TRR<2> of the counting signal CNT_TRR<0:3> outputted from the target address counter 342 is deactivated at a logic low level and the third bit CNT_TRR<3> of the counting signal CNT_TRR<0:3> is activated at a logic high level.

Since the activation of the third bit CNT_TRR<3> of the counting signal CNT_TRR<0:3> outputted from the target address counter 342 to the logic high level means the activation of the mode exit signal TRR_EXIT, the mode enable signal TRR_EN is correspondingly deactivated to the logic low level, and the semiconductor device exits from the target activation mode.

Although the source address IN_ADDR has the value L of the target address TRR_ADDR when a fourth active command 4TH ACT_CMD is applied, since the mode enable signal TRR_EN is deactivated to the logic low level to exit from the target activation mode, an additional operation is not performed due to the source address IN_ADDR having the value L of the target address TRR_ADDR, except that a word line WL corresponding to the source address IN_ADDR is activated and precharged.

According to the embodiments described above, it may be possible to refresh memory cells connected to word lines adjacent to a word line with a large number of activation times (or a high activation frequency), thereby substantially preventing the data of the memory cells from being degraded due to word line disturbance.

Also, according to the embodiments, it may be possible to refresh the memory cells connected to word lines adjacent to a word line with a large number of activation times (or a high activation frequency), without being applied with separate addresses, thereby shortening a time required to prevent the data of the memory cells from being degraded due to word line disturbance.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors exemplified in the above-described embodiments should be differently realized according to the polarities of the signals inputted thereto.

What is claimed is:

1. A semiconductor memory device comprising:
a plurality of word lines each of which are connected to a plurality of memory cells;
a row control unit suitable for sequentially activating and precharging a word line corresponding to a target address and a predetermined (N) number of adjacent word lines during a target activation mode; and
a mode exit control unit suitable for counting the number of activation operations by the row control unit during the target activation mode to determine whether or not to exit from the target activation mode,
wherein a source address for selecting the word lines is classified as a target address of which activation-precharge history satisfies a predetermined condition and a normal address of which activation-precharge history does not satisfy the predetermined condition.

2. The semiconductor memory device according to claim 1, wherein the semiconductor memory device enters the target activation mode by a mode register set (MRS) setting or a preset command.

3. The semiconductor memory device according to claim 1, wherein the source address for selecting the word lines corresponds to the target address during the target active mode and to the normal address when the target active mode is entered.

4. The semiconductor memory device according to claim 1, wherein the target activation mode is entered in response to applied commands and addresses.

5. The semiconductor memory device according to claim 3,
wherein the row control unit sequentially activates and precharges the target word line and the N number of adjacent word lines, when the target address is applied together with an active command, during the target activation mode,
wherein the row control unit activates and precharges a word line corresponding to the normal address, when the normal address is applied together with the active command, during the target activation mode, and
wherein the row control unit activates and precharges a word line corresponding to the source address, when the source address is applied together with the active command, after exiting from the target activation mode.

6. The semiconductor memory device according to claim 3, further comprising:
an address input unit suitable for receiving the source address, which is applied from an outside;
a target address latch suitable for storing the target address during the target activation mode; and
an address determination unit suitable for determining whether a value of the source address applied to the address input unit during the target activation mode corresponds to a value of the target address.

7. The semiconductor memory device according to claim 5, wherein the mode exit control unit counts the number of activation operations of the target word line and the N number of adjacent word lines by the row control unit and does not count the number of activation operations of the word line corresponding to the normal address by the row control unit, during the target activation mode, and causes the semiconductor memory device to exit from the target activation mode when the counting number reaches N+1.

8. The semiconductor memory device according to claim 6, wherein the mode exit control unit comprises:
a target address counter suitable for counting the number of times in which the value of the source address corresponds to the value of the target address based on an operation of the address determination unit during the target activation mode; and
a mode exit signal output section suitable for activating a mode exit signal when a counting number of the target address counter reaches N+1.

9. The semiconductor memory device according to claim 6, wherein the row control unit comprises:
an address selecting section suitable for sequentially selecting N number of addresses with adjacent values of the value of the target address, when the value of the source address is determined to correspond to the value of the target address by the address determination unit during the target activation mode; and
a row driving section suitable for sequentially activating and precharging word lines corresponding to the target address and the N number of addresses selected by the address selecting section in response to the active command during the target activation mode.

10. The semiconductor memory device according to claim 6, further comprising:

a source address latch suitable for storing the source address applied from the address input unit; and
a refresh operation control unit suitable for preventing a general refresh operation from being performed during the target activation mode, in the case where an address stored in the source address latch is used as a refresh address in the general refresh operation.

11. The semiconductor memory device according to claim 9,
wherein, when the source address applied together with the active command during the target activation mode first has the value of the target address, the address selecting section selects the N number of addresses, and the row driving section activates and precharges the word line corresponding to the target address, and
wherein, when the source address applied together with the active command after the word line corresponding to the target address is activated and precharged has the value of the target address, the row driving section sequentially activates and precharges the word lines corresponding to the N number of addresses selected by the address selecting section.

12. The semiconductor memory device according to claim 9, wherein the address selecting section selects at least two addresses respectively corresponding to at least two adjacent word lines, which are disposed adjacent on both sides to the word line corresponding to the target address, as the N number of addresses.

13. A memory system comprising:
a memory controller suitable for transmitting a mode register set (MRS) setting signal or a target activation command for entry into a target activation mode, active and precharge commands for performing activation and precharge operations, and a source address for selecting the word lines, wherein the source address is classified as a target address of which activation-precharge history satisfies a predetermined condition and a normal address of which activation-precharge history does not satisfy the predetermined condition; and
a semiconductor memory device suitable for entering the target activation mode in response to the MRS setting signal or the target activation command, sequentially activating and precharging a target word line corresponding to the target address and a predetermined (N) number of adjacent word lines during the target activation mode, and exiting from the target activation mode by counting the number of activation operations.

14. The memory system according to claim 13, wherein the memory controller comprises:
an address detection unit suitable for detecting the source address as the target address when the number of times in which the source address is transmitted to the semiconductor memory device together with an active command is at least a reference number of times, and detecting the source address as the normal address when the number of times in which the source address is transmitted to the semiconductor memory device together with the active command is less than the reference number of times;
a command generation unit suitable for generating the active and precharge commands, and generating the target activation command based on an output signal of the address detection unit; and
an address generation unit suitable for generating the source address, and generating the MRS setting signal based on the output signal of the address detection unit.

15. The memory system according to claim 13, wherein the semiconductor memory device comprises:
- a row control unit suitable for sequentially activating and precharging the word line corresponding to the target address and the N number of adjacent word lines during the target activation mode; and
- a mode exit control unit suitable for counting the number of activation operations by the row control unit during the target activation mode to determine whether or not to exit from the target activation mode.

16. The memory system according to claim 15,
wherein the row control unit sequentially activates and precharges the target word line and the N number of adjacent word lines, when the target address is applied together with the active command, during the target activation mode,
wherein the row control unit activates and precharges a word line corresponding to the normal address, when the normal address is applied together with the active command, during the target activation mode, and
wherein the row control unit activates and precharges a word line corresponding to the source address, when the source address is applied together with the active command, after exiting from the target activation mode.

17. The memory system according to claim 15, wherein the semiconductor memory device further comprises:
- an address input unit suitable for receiving the source address, which is transmitted from the memory controller;
- a target address latch suitable for storing the target address during the target activation mode; and
- an address determination unit suitable for determining whether a value of the source address applied to the address input unit during the target activation mode corresponds to a value of the target address.

18. The memory system according to claim 14, wherein the mode exit control unit counts the number of activation operations of the target word line and the N number of adjacent word lines by the row control unit and does not count the number of activation operations of the word line corresponding to the normal address by the row control unit, during the target activation mode, and causes the semiconductor memory device to exit from the target activation mode when the counting number reaches N+1.

19. The memory system according to claim 17, wherein the mode exit control unit comprises:
- a target address counter suitable for counting the number of times in which the value of the source address corresponds to the value of the target address based on an operation of the address determination unit during the target activation mode; and
- a mode exit operating section suitable for causing the semiconductor memory device to exit from the target activation mode when a counting number of the target address counter reaches N+1.

20. The memory system according to claim 17, wherein the row control unit comprises:
- an address selecting section suitable for sequentially selecting N number of addresses with adjacent values of the value of the target address, when the value of the source address is determined to correspond to the value of the target address by the address determination unit during the target activation mode; and
- a row driving section suitable for sequentially activating and precharging word lines corresponding to the target address and the N number of addresses selected by the address selecting section in response to the active command during the target activation mode.

21. The memory system according to claim 17, wherein the semiconductor memory device further comprises:
- a source address latch suitable for storing the source address applied from the address input unit; and
- a refresh operation control unit suitable for preventing a general refresh operation from being performed during the target activation mode, in the case where an address stored in the source address latch is used as a refresh address in the general refresh operation.

22. The memory system according to claim 20,
wherein, when the source address applied together with the active command during the target activation mode first has the value of the target address, the address selecting section selects the N number of addresses, and the row driving section activates and precharges the word line corresponding to the target address, and
wherein, when the source address applied together with the active command after the word line corresponding to the target address is activated and precharged has the value of the target address, the row driving section sequentially activates and precharges the word lines corresponding to the N number of addresses selected by the address selecting section.

23. The memory system according to claim 20, wherein the address selecting section selects at least two addresses respectively corresponding to at least two adjacent word lines, which are disposed adjacent on both sides to the word line corresponding to the target address, as the N number of addresses.

* * * * *